(12) United States Patent
Okamoto et al.

(10) Patent No.: US 10,476,133 B2
(45) Date of Patent: Nov. 12, 2019

(54) ELECTRICAL ELEMENT, MOBILE DEVICE, AND METHOD FOR MANUFACTURING ELECTRICAL ELEMENT

(71) Applicant: Murata Manufacturing Co., Ltd., Nagaokakyo-shi, Kyoto-fu (JP)

(72) Inventors: Bunta Okamoto, Nagaokakyo (JP); Isamu Morita, Nagaokakyo (JP); Satoshi Ishino, Nagaokakyo (JP); Jun Sasaki, Nagaokakyo (JP); Yoshihito Otsubo, Nagaokakyo (JP); Keisuke Araki, Nagaokakyo (JP); Norio Sakai, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 218 days.

(21) Appl. No.: 15/256,822

(22) Filed: Sep. 6, 2016

(65) Prior Publication Data

US 2016/0372819 A1 Dec. 22, 2016

Related U.S. Application Data

(63) Continuation of application No. PCT/JP2014/082209, filed on Dec. 5, 2014.

(30) Foreign Application Priority Data

Mar. 27, 2014 (JP) .................. 2014-064956

(51) Int. Cl.
*H01Q 1/24* (2006.01)
*H01Q 1/38* (2006.01)
(Continued)

(52) U.S. Cl.
CPC .............. *H01Q 1/243* (2013.01); *H01Q 1/38* (2013.01); *H01Q 1/48* (2013.01); *H05K 1/02* (2013.01); *H05K 1/14* (2013.01)

(58) Field of Classification Search
CPC ........... H01Q 1/24; H01Q 1/243; H01Q 1/38; H01Q 1/48; H05K 1/02; H05K 1/14
(Continued)

(56) References Cited

U.S. PATENT DOCUMENTS 3,374,531 A * 3/1968 Bruce .................... B23K 1/005
219/85.13
4,815,981 A * 3/1989 Mizuno .................. H05K 1/118
439/77

(Continued)

FOREIGN PATENT DOCUMENTS

FR 2754416 A1 4/1998
JP 63-158711 A 7/1988
(Continued)

OTHER PUBLICATIONS

Official Communication issued in International Patent Application No. PCT/JP2014/082209, dated Mar. 3, 2015.
(Continued)

*Primary Examiner* — Huedung X Mancuso
(74) *Attorney, Agent, or Firm* — Keating & Bennett, LLP

(57) ABSTRACT

An electrical element includes a flexible antenna and a rigid member higher in rigidity than the flexible antenna. At least one of the flexible antenna and the rigid member is made of thermoplastic resin. A conductor pattern defining at least a portion of a section that performs the main function of the electrical element is provided at the flexible antenna. No conductor pattern that performs the main function of the electrical element is provided at the rigid member. Opposing surfaces of the flexible antenna and the rigid member are directly joined to each other.

20 Claims, 16 Drawing Sheets

(51) Int. Cl.
*H05K 1/02* (2006.01)
*H05K 1/14* (2006.01)
*H01Q 1/48* (2006.01)

(58) Field of Classification Search
USPC ........................................................ 343/702
See application file for complete search history.

(56) References Cited

U.S. PATENT DOCUMENTS

| | | | | |
|---|---|---|---|---|
| 5,111,363 | A * | 5/1992 | Yagi | H05K 1/189 |
| | | | | 361/751 |
| 5,354,392 | A | 10/1994 | Santo et al. | |
| 5,574,470 | A * | 11/1996 | de Vall | G06K 7/10336 |
| | | | | 340/572.7 |
| 5,867,128 | A * | 2/1999 | Sauer | H01Q 1/1278 |
| | | | | 343/713 |
| 6,164,984 | A * | 12/2000 | Schreiner | H01Q 1/1271 |
| | | | | 439/86 |
| 7,322,833 | B1 * | 1/2008 | Hakansson | H01Q 1/38 |
| | | | | 439/67 |
| 9,247,635 | B2 * | 1/2016 | Chen | H05K 1/028 |
| 9,357,639 | B2 * | 5/2016 | Holec | H01R 4/02 |
| 2006/0067070 | A1 | 3/2006 | Otsuki | |
| 2008/0316116 | A1 * | 12/2008 | Hobson | H01Q 1/243 |
| | | | | 343/702 |
| 2009/0067141 | A1 * | 3/2009 | Dabov | H01Q 1/243 |
| | | | | 361/753 |
| 2011/0255850 | A1 * | 10/2011 | Dinh | G03B 15/03 |
| | | | | 396/176 |
| 2012/0162047 | A1 | 6/2012 | Mizuno et al. | |
| 2012/0275124 | A1 * | 11/2012 | Pludra | H05K 1/142 |
| | | | | 361/749 |
| 2014/0062794 | A1 * | 3/2014 | Guo | H01Q 9/0414 |
| | | | | 343/700 MS |
| 2014/0078017 | A1 | 3/2014 | Vanjani et al. | |

FOREIGN PATENT DOCUMENTS

| | | |
|---|---|---|
| JP | 02-79493 A | 3/1990 |
| JP | 05-205841 A | 8/1993 |
| JP | 06-227188 A | 8/1994 |
| JP | 09-8453 A | 1/1997 |
| JP | 2003-007379 A | 1/2003 |
| JP | 2006-100302 A | 4/2006 |
| JP | 2009-218447 A | 9/2009 |
| JP | 2012-151829 A | 8/2012 |

OTHER PUBLICATIONS

Official Communication issued in corresponding Japanese Patent Application No. 2016-509905, dated Feb. 6, 2018.

* cited by examiner

ELECTRICAL ELEMENT, MOBILE DEVICE, AND METHOD FOR MANUFACTURING ELECTRICAL ELEMENT

CROSS REFERENCE TO RELATED APPLICATIONS

This application claims the benefit of priority to Japanese Patent Application 2014-064956 filed Mar. 27, 2014 and is a Continuation Application of PCT/JP2014/082209 filed on Dec. 5, 2014. The entire contents of each application are hereby incorporated herein by reference.

BACKGROUND OF THE INVENTION

1. Field of the Invention

The present invention relates to an electrical element including a flexible substrate and a rigid member, a mobile device including the electrical element, and a method for manufacturing the electrical element.

2. Description of the Related Art

An electrical element that includes a flexible substrate and a rigid member being higher in rigidity than the flexible substrate is disclosed in, for example, Japanese Unexamined Patent Application Publication No. 2009-218447. Japanese Unexamined Patent Application Publication No. 2009-218447 discloses that, a resin reinforcement plate (a rigid member) being a hard plate is bonded, with an adhesive agent, to the main surface of a flexible printed circuit board (a flexible substrate) on which a conductor pattern is formed.

Such bonding of the resin reinforcement plate to the flexible printed circuit board with an adhesive agent as in the electrical element disclosed in Japanese Unexamined Patent Application Publication No. 2009-218447 may cause variations in the dimensional precision of the flexible printed circuit board and the resin reinforcement plate joined to each other. It may also cause variations in the positional precision of the resin reinforcement plate relative to the flexible printed circuit board, or variations in the joined state between the flexible printed circuit board and the resin reinforcement plate. That is, the electrical element described in Japanese Unexamined Patent Application Publication No. 2009-218447 may suffer from poor joining precision between the flexible printed circuit board and the resin reinforcement plate.

SUMMARY OF THE INVENTION

Preferred embodiments of the present invention provide an electrical element with excellent joining precision between a flexible substrate and a rigid member, a mobile device including the electrical element, and a method for manufacturing the electrical element.

An electrical element according to a preferred embodiment of the present invention includes a flexible substrate and a rigid member being greater than the flexible substrate in thickness and in rigidity. At least one of the flexible substrate and the rigid member is made of thermoplastic resin. A conductor pattern that defines at least a portion of a section that performs a main function of the electrical element is provided at the flexible substrate. No conductor pattern that defines the section that performs the main function of the electrical element is provided at the rigid member. The flexible substrate and the rigid member have their respective opposing surfaces directly joined to each other. Note that, the section that performs the main function of the electrical element refers to a coil when the electrical element is a coil element. Alternatively, it refers to a signal line or a ground conductor when the electrical element is a transmission line element. The conductor pattern that defines the section that performs the main function of the electrical element is patterned taking into consideration the characteristic of the main function of the electrical element.

In this structure, the rigid member is directly joined to the flexible substrate without using any other member such as an adhesive agent, solder, and screws. This implements the electrical element with excellent joining precision between the flexible substrate and the rigid member.

Further, for example, when a flexible portion and a rigid portion are formed by a multilayer substrate including a lamination of a plurality of base layers, and removing unnecessary portions therefrom, a great amount of materials is wasted. Further, the entire base layers must be heated when the base layers undergo thermocompression bonding. In the structure of a preferred embodiment of the present invention, since the flexible substrate and the rigid member are previously separately manufactured and then directly joined to each other, no materials are wasted. Further, when the flexible substrate and the rigid member are joined to each other, only the portions of the flexible substrate and the rigid member where they are in contact with each other should be locally heated.

In an electrical element according to a preferred embodiment of the present invention, the rigid member may be a spacer that maintains an interval between the flexible substrate and other member near the electrical element.

In general, the characteristic of the electrical element changes depending on the distance between the electrical element and any metal member near the electrical element. In this structure, variations in the dimensional precision of the flexible substrate and the rigid member being joined to each other and variations in the positional precision of the rigid member relative to the flexible substrate are small. Accordingly, the use of the rigid member as a spacer significantly reduces or prevents variations in the relative positional relationship between the flexible substrate and other member near the electrical element. As a result, variations in the characteristic of the electrical element are significantly reduced or prevented even if the other member near the electrical element is a metal member.

In an electrical element according to a preferred embodiment of the present invention, the conductor pattern provided at the flexible substrate may define at least a portion of a high-frequency circuit that performs the main function.

When an electrical element according to a preferred embodiment of the present invention is used at a high frequency band, the characteristic of the electrical element is particularly influenced by a metal member near the electrical element. Accordingly, the advantageous effects of a preferred embodiment of the present invention are particularly significant in this structure.

In an electrical element according to a preferred embodiment of the present invention, the high-frequency circuit may be an antenna circuit.

The characteristic of an antenna is particularly influenced by a metal member near the antenna. Accordingly, the advantageous effects of a preferred embodiment the present invention are particularly significant in this structure.

An electrical element according to a preferred embodiment of the present invention may be structured as follows. The rigid member includes a first surface joined to the flexible substrate and a second surface opposite to the first surface. A ground conductor is disposed on substantially the entire second surface of the rigid member. A lead-out wiring extends from the ground conductor to the first surface of the rigid member and to connect to the antenna circuit. Note that, the ground conductor and the lead-out wiring are not patterned taking into consideration the characteristic of the main function (the function as an antenna) of the electrical element, and therefore they are not conductor patterns that define a section that performs the main function of the electrical element.

This structure significantly reduces or prevents variations in the relative positional relationship between the flexible substrate and the ground conductor, and therefore significantly reduces or prevents variations in the characteristic of the electrical element.

In an electrical element according to a preferred embodiment of the present invention, no conductor pattern may be provided at the rigid member.

In this structure, at the rigid member, no conductor pattern including the conductor pattern relating to the main function of the electrical element is provided. Thus, the structure of the rigid member is simplified.

In an electrical element according to a preferred embodiment of the present invention, the flexible substrate and the rigid member are preferably respectively made of thermoplastic resins that are identical or substantially identical to each other in a main component.

In this structure, the base layer of the flexible substrate and the rigid member are respectively made of thermoplastic resins that are identical or substantially identical to each other in the main component, and therefore the base layer of the flexible substrate and the rigid member are identical or substantially identical to each other in the dielectric constant. Between the flexible substrate and the rigid member, no layer being different in the dielectric constant from the thermoplastic resins, for example, no layer made of an adhesive agent, is interposed. This aids in controlling the characteristic of the electrical element, such that deterioration of the characteristic of the electrical element is significantly reduced or prevented. Note that, despite the base layer of the flexible substrate and the rigid member being identical or substantially identical to each other in the main component, the rigidity of the rigid member is easily increased by increasing the thickness of the rigid member to be greater than that of the flexible substrate.

Further, the base layer of the flexible substrate and the rigid member are identical or substantially identical to each other in the thermal expansion coefficient. Between the flexible substrate and the rigid member, no layer being different in the thermal expansion coefficient from the thermoplastic resins, for example, no layer made of an adhesive agent, is interposed. This prevents joining failure between the base layer of the flexible substrate and the rigid member attributed to the difference in the thermal expansion coefficient.

A mobile device according to a preferred embodiment of the present invention includes an electrical element according to a preferred embodiment of the present invention. In the mobile device according to a preferred embodiment of the present invention, the electrical element is in contact with a member inside the mobile device via the rigid member.

Since the mobile device has numerous members disposed in the narrow internal space thereof, the electrical element is inevitably disposed near other members. Accordingly, the advantageous effects of a preferred embodiment the present invention are particularly significant in this structure.

A method for manufacturing an electrical element according to a preferred embodiment of the present invention is a method for manufacturing an electrical element including a flexible substrate and a rigid member being greater than the flexible substrate in thickness and in rigidity, the rigid member being provided with no conductor pattern that defines a section that performs a main function of the electrical element. The method for manufacturing an electrical element according to a preferred embodiment of the present invention includes bringing the rigid member into contact with a portion of a main surface of the flexible substrate; and directly joining respective opposing surfaces of the flexible substrate and the rigid member to each other by locally heating respective portions of the flexible substrate and the rigid member where the flexible substrate and the rigid member are in contact with each other and melting thermoplastic resin that defines at least one of the flexible substrate and the rigid member.

In this structure, only the portions of the flexible substrate and the rigid member that are in contact with each other are locally heated, so that thermoplastic resin corresponding to the heated portions only is locally molten. Accordingly, the flexible substrate and the rigid member do not largely plastically deform. Further, adjusting the heating temperature is able to easily control the flowability of the thermoplastic resin. As a result, the electrical element with high dimensional precision is able to be manufactured.

In a method for manufacturing an electrical element according to a preferred embodiment of the present invention, wherein, in the joining, the respective portions of the flexible substrate and the rigid member where the flexible substrate and the rigid member are in contact with each other are preferably heated by application of ultrasonic vibrations.

In this structure, friction between the flexible substrate and the rigid member efficiently heats only the portions where the flexible substrate and the rigid member are in contact with each other.

Various preferred embodiments of the present invention provide electrical elements with excellent joining precision between the flexible substrate and the rigid member.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1A:
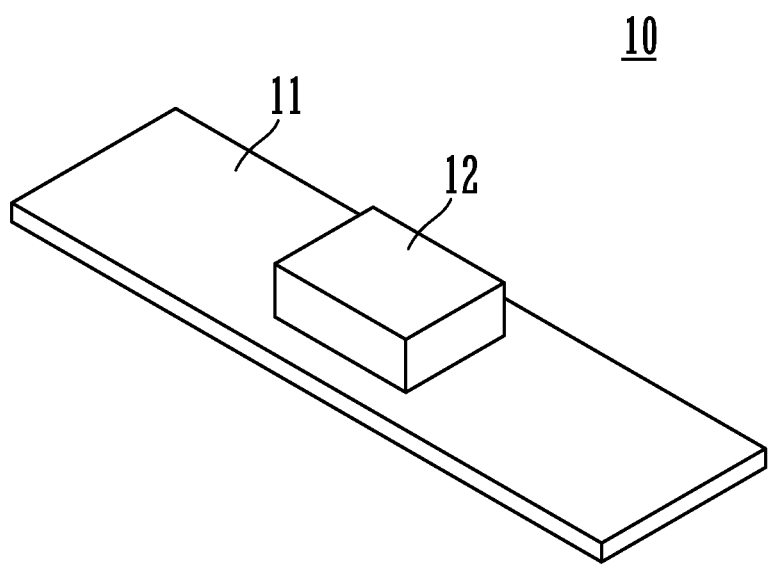
FIG. 1A is an external perspective view of an electrical element according to a first preferred embodiment of the present invention.
Figure 1B:
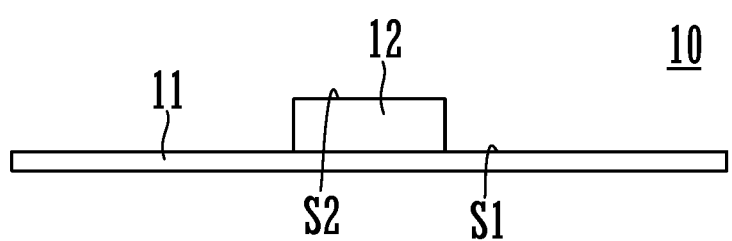
FIG. 1B is a side view of the electrical element according to the first preferred embodiment of the present invention.

A description will be given of an electrical element according to a first preferred embodiment of the present invention. FIG. 1A is an external perspective view of the electrical element 10. FIG. 1B is a side view of the electrical element 10. The electrical element 10 includes a quadrangular plate-shaped flexible antenna 11 and a rectangular parallelepiped rigid member 12. The flexible antenna 11 is flexible, and the rigid member 12 is higher in rigidity than the flexible antenna 11 and is rigid. The rigid member 12 is directly joined to a main surface S1 of the flexible antenna 11. In other words, the rigid member 12 and the flexible antenna 11 are joined to each other having no other member (e.g., an adhesive agent) interposed between them. The flexible antenna 11 is an example of the flexible substrate.

The flexible antenna 11 preferably includes laminated flexible base layers and a conductor pattern (not shown) provided at the base layers. The base layers of the flexible antenna 11 are made of thermoplastic resin such as liquid crystal polymers. The conductor pattern preferably has, for example, a coil shape, and defines and functions as a coil antenna.

The rigid member 12 is used as a spacer to maintain an interval between the flexible antenna 11 and other members near the electrical element 10. The rigid member 12 is made of thermoplastic resin such as liquid crystal polymers. The flexible antenna 11 and the rigid member 12 are respectively made of thermoplastic resins being identical or substantially identical to each other in the main component. No conductor pattern is provided at the rigid member 12.

That is, at least one of the flexible antenna 11 and the rigid member 12 is made of thermoplastic resin. A conductor pattern that defines at least a portion of a section that performs the main function (the function as an antenna) of the electrical element 10 is provided at the flexible antenna 11. No conductor pattern that defines the section that performs the main function of the electrical element 10 is provided at the rigid member 12. Forming a conductor pattern which is designed taking into consideration the main function characteristic of the electrical element 10 to the rigid member 12 may result in variations in the high frequency characteristic attributed to the positional precision of the rigid member 12 and the flexible antenna 11 being joined to each other. The flexible antenna 11 and the rigid member 12 have their respective opposing surfaces directly joined to each other. The conductor pattern provided at the flexible antenna 11 defines at least a portion of a high-frequency circuit that performs the main function. The high-frequency circuit is an antenna circuit.

When the flexible antenna 11 and other member are disposed with the rigid member 12 interposed between them, a main surface S2 of the rigid member 12 which is oriented in the same direction as the main surface S1 of the flexible antenna 11 is brought into contact with the other member. This maintains a constant interval between the flexible antenna 11 and the other member.

Figure 2:
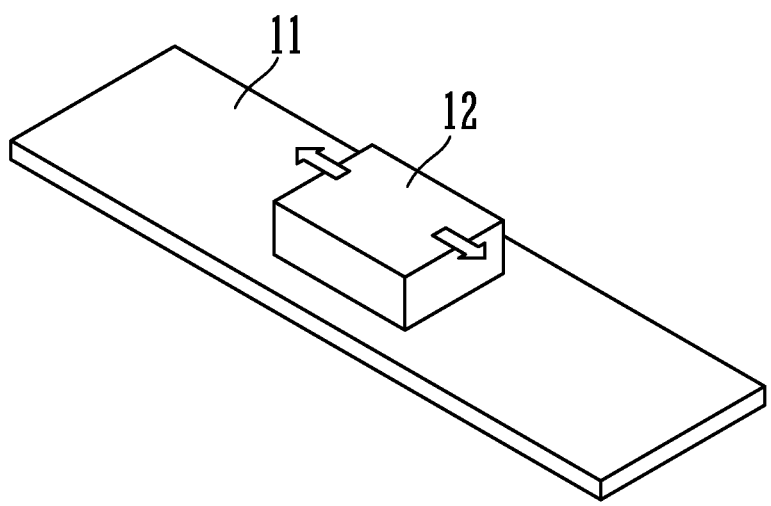
FIG. 2 is an external perspective view showing a method for manufacturing the electrical element according to the first preferred embodiment of the present invention.

FIG. 2 is an external perspective view showing a method for manufacturing the electrical element 10. As shown in FIG. 2, the flexible antenna 11 and the rigid member 12 are joined to each other by ultrasonic welding, which allows the flexible antenna 11 and the rigid member 12 to be efficiently heated only at the portions where they are in contact with each other. Specifically, the rigid member 12 is brought into contact with the upper surface of the flexible antenna 11 under pressure. In this state, ultrasonic vibrations are applied to the flexible antenna 11 and the rigid member 12. The portions of the flexible antenna 11 and the rigid member 12 being in contact with each other are heated by friction, such that thermoplastic resin corresponding to the portions in contact is molten. Thus, the flexible antenna 11 and the rigid member 12 are joined to each other.

That is, the rigid member 12 is brought into contact with a portion of the main surface of the flexible antenna 11. In this state, the portions of the flexible antenna 11 and the rigid member 12 where they are in contact with each other are locally heated, so that thermoplastic resin structuring at least one of the flexible antenna 11 and the rigid member 12 is molten. Thus, respective opposing surfaces of the flexible antenna 11 and the rigid member 12 are directly joined to each other.

In general, a change in the distance between an electrical element and any metal member near the electrical element changes the coupling level in terms of electric fields or magnetic fields between a conductor pattern provided at the electrical element and the metal member. Accordingly, the positional relationship between an electrical element and a metal member influences the characteristic of the electrical element. This influence becomes particularly significant when an electrical element defines and functions as an antenna.

In the first preferred embodiment, variations in the dimensional precision of the flexible antenna 11 and the rigid member 12 being joined to each other and variations in the positional precision of the rigid member 12 relative to the flexible antenna 11 are small. Accordingly, use of the rigid member 12 as a spacer significantly reduces or prevents variations in the relative positional relationship between the flexible antenna 11 and other member near the electrical element 10. As a result, variations in the characteristic of the electrical element 10 are significantly reduced or prevented even if the other member near the electrical element 10 is a metal member.

For example, variations in the distance between the main surface S1 of the flexible antenna 11 and the main surface S2 of the rigid member 12 reduce. Accordingly, disposing the flexible antenna 11 and other member having the rigid member 12 interposed between them significantly reduce or prevent variations in the relative positional relationship between the flexible antenna 11 and the other member.

Further, the base layers of the flexible antenna 11 and the rigid member 12 are respectively made of thermoplastic resins that are identical or substantially identical to each other in the main component, and therefore the base layers of the flexible antenna 11 and the rigid member 12 are identical or substantially identical to each other in the dielectric constant. Between the flexible antenna 11 and the rigid member 12, no layer being different in the dielectric constant from the thermoplastic resins, for example, no layer made of an adhesive agent, is interposed. This aids in controlling the characteristic of the flexible antenna, such that deterioration of the characteristic of the flexible antenna is significantly reduced or prevented.

Still further, the base layers of the flexible antenna and the rigid member 12 are respectively made of thermoplastic resins that are identical or substantially identical to each other in the main component, and therefore the base layers of the flexible antenna 11 and the rigid member 12 are identical or substantially identical to each other in the thermal expansion coefficient. Between the flexible antenna 11 and the rigid member 12, no layer being different in the thermal expansion coefficient from the thermoplastic resins, for example, no layer made of an adhesive agent, is interposed. This prevents joining failure between the flexible antenna 11 and the rigid member 12 attributed to the difference in the thermal expansion coefficient.

Still further, when the flexible antenna 11 and the rigid member 12 are joined to each other, only the portions of the flexible antenna 11 and the rigid member 12 where they are in contact with each other are locally heated, so that thermoplastic resin corresponding to the heated portions only is locally molten. Accordingly, the flexible antenna 11 and the rigid member 12 do not largely plastically deform. Still further, provided that resist is provided at the flexible antenna 11, the resist hardly deforms. Still further, adjusting the heating temperature easily controls the flowability of the thermoplastic resin structuring the flexible antenna 11 and the rigid member 12. As a result, the electrical element 10 with excellent dimensional precision is able to be manufactured.

Still further, for example, when a flexible portion and a rigid portion are defined by forming a multilayer substrate including a lamination of a plurality of base layers, and removing unnecessary portions therefrom, a great amount of materials is wasted. In the first preferred embodiment, since the flexible antenna 11 and the rigid member 12 are previously separately manufactured and then directly joined to each other, the wasted materials are significantly reduced or prevented. Accordingly, the first preferred embodiment requires a smaller amount of materials as compared to the scheme illustrated above. Further, according to the illustrated scheme, the entire base layers must be heated when the base layers undergo thermocompression bonding. On the other hand, in the first preferred embodiment, when the flexible antenna 11 and the rigid member 12 are joined to each other, only the portions of the flexible antenna 11 and the rigid member 12 where they are in contact with each other should be locally heated.

Note that, in the first preferred embodiment, while the flexible antenna 11 and the rigid member 12 are preferably made of identical or substantially identical thermoplastic resin, the flexible substrate and the rigid member of the present invention are not limited thereto. The flexible substrate and the rigid member may be respectively made of separate thermoplastic resins differing from each other in the main component. Further, it is possible that at least one of the flexible substrate and the rigid member is made of thermoplastic resin. Therefore, for example, the flexible substrate may be made of thermoplastic resin while the rigid member is made of thermosetting resin.

Further, while the flexible antenna 11 according to the first preferred embodiment preferably includes laminated base layers, the flexible substrate of the present invention is not limited thereto. The flexible substrate of the present invention may be defined by a single base layer. Further, the rigid member according to a preferred embodiment of the present invention may be defined by a multilayer substrate, or by a single-layer substrate.

Still further, in the first preferred embodiment, while ultrasonic vibrations are applied to the rigid member 12 in order to locally heat the portions of the flexible antenna 11 and the rigid member 12 where they are in contact with each other, the present invention is not limited thereto. In the present invention, an iron heated to a predetermined heating temperature by a heater may be applied to the portions of the flexible antenna 11 and the rigid member 12 where they are in contact with each other.

Still further, while the conductor pattern provided at the flexible antenna 11 according to the first preferred embodiment defines an antenna, the conductor pattern provided at the flexible substrate of the present invention is not limited thereto. The conductor pattern provided at the flexible substrate of the present invention may define, for example, a high-frequency circuit other than an antenna, such as a high-frequency transmission line. Alternatively, the conductor pattern may define a section that performs the main function of the electrical element other than a high-frequency circuit.

Second Preferred Embodiment

Figure 3:
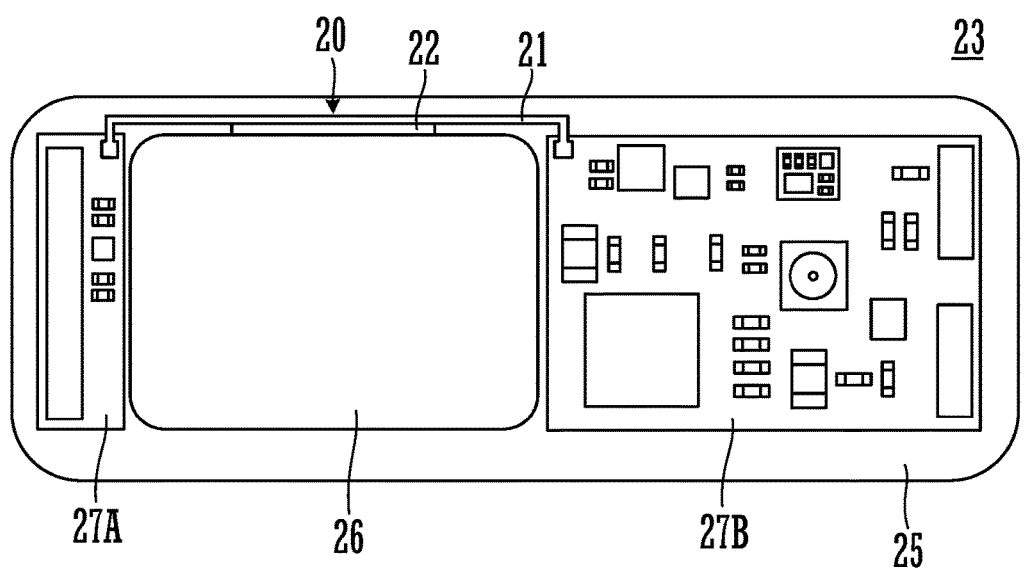
FIG. 3 is a plan view showing the inside of a mobile device according to a second preferred embodiment of the present invention.

A description will be given of a mobile device 23 according to a second preferred embodiment of the present invention. FIG. 3 is a plan view showing the inside of the mobile device 23. The mobile device 23 includes an electrical element 20, a housing 25, a battery pack 26, and circuit boards 27A and 27B.

The electrical element 20 includes a transmission line and a rigid member 22 higher in rigidity than the transmission line 21. The transmission line 21 corresponds to the flexible substrate. At least one of the transmission line 21 and the rigid member 22 is made of thermoplastic resin. A conductor pattern that defines at least a portion of a section that performs the main function (the function of transmitting signals) of the electrical element 20 is provided at the transmission line 21. No conductor pattern that defines the section that performs the main function of the electrical element 20 is provided at the rigid member 22. The transmission line 21 and the rigid member 22 have their respective opposing surfaces directly joined to each other.

The circuit board 27A, the battery pack 26, and the circuit board 27B are provided inside the housing 25 in this order along the long-side direction of the housing 25. The wiring on the circuit board 27A and the wiring on the circuit board 27B are connected to each other by the transmission line 21. The transmission line 21 extends in the clearance between the side surface of the housing 25 and the side surface of the battery pack 26. The rigid member 22 used as a spacer is provided between the transmission line 21 and the battery pack 26. The rigid member 22 is in contact with the battery pack 26. That is, the electrical element 20 is in contact with the member in the mobile device 23 via the rigid member 22.

Similarly to the first preferred embodiment, the second preferred embodiment significantly reduces or prevents variations in the relative positional relationship between the transmission line 21 and other member in the housing 25. Accordingly, variations in the characteristic of the transmission line 21 are significantly reduced or prevented despite the battery pack 26 being positioned near the transmission line 21.

Since the mobile device has numerous members disposed in the narrow internal space thereof, the electrical element is inevitably disposed near other members. Therefore, an electrical element according to a preferred embodiment of the present invention is particularly useful when built in a mobile device.

Third Preferred Embodiment

Figure 4:
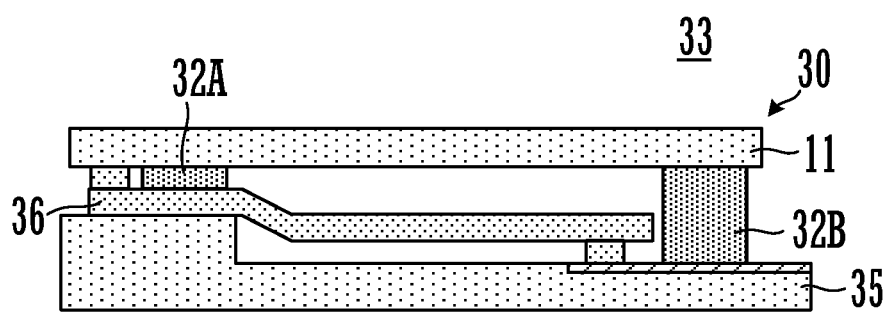
FIG. 4 is a cross-sectional view partially showing a mobile device according to a third preferred embodiment of the present invention.

A description will be given of a mobile device 33 according to a third preferred embodiment of the present invention. FIG. 4 is a cross-sectional view partially showing the mobile device 33. The mobile device 33 includes an electrical element 30, a motherboard 35, and an inductor bridge 36.

The electrical element 30 includes a flexible antenna 11 and rigid members 32A and 32B being higher in rigidity than the flexible antenna 11. At least one of the flexible antenna 11 and the rigid members 32A and 32B is made of thermoplastic resin. A conductor pattern that defines at least a portion of a section that performs the main function of the electrical element 30 is provided at the flexible antenna 11. No conductor pattern that defines the section that performs the main function of the electrical element 30 is provided at the rigid members 32A and 32B. The flexible antenna 11 and the rigid members 32A and 32B have their respective opposing surfaces directly joined to each other.

The electrical element 30 is provided above the motherboard 35. The inductor bridge 36 is provided between the motherboard 35 and the electrical element 30. Wiring at the upper surface of the motherboard 35 and the flexible antenna 11 of the electrical element 30 are connected to each other by the inductor bridge 36.

The motherboard 35 includes a first end and a second end positioned opposite to the first end. The first end of the motherboard 35 is greater in thickness than other portions of the motherboard 35. The flexible antenna 11 is disposed above and in parallel or substantially in parallel to the motherboard 35. The rigid members 32A and 32B of the electrical element 30 are provided at the lower surface of the flexible antenna 11. The rigid members 32A and 32B are used as spacers. The rigid member 32B is greater in thickness than the rigid member 32A.

The inductor bridge 36 includes laminated, flexible and elongated base layers, and a conductor pattern (not shown) provided at the base layers. The conductor pattern defines a transmission line. Further, a portion of the conductor pattern preferably is coil-shaped or meandering, so as to define an inductor. The inductor bridge 36 extends from the first end of the motherboard 35 toward the second end of the motherboard 35 along the upper surface of the motherboard 35. Connectors are provided respectively at the opposite ends of the inductor bridge 36.

On the first end side of the motherboard 35, the end of the inductor bridge 36 is connected to the lower surface of the flexible antenna 11 via the connector. Further, on the first end side of the motherboard 35, the rigid member 32A is disposed between the flexible antenna 11 and the inductor bridge 36. The upper surface of the rigid member 32A is joined to the flexible antenna 11, and the lower surface of the rigid member 32A is in contact with the inductor bridge 36.

On the second end side of the motherboard 35, the end of the inductor bridge 36 is connected to the wiring of the motherboard 35 via the connector. Further, on the second end side of the motherboard 35, the rigid member 32B is disposed between the flexible antenna 11 and the motherboard 35. The upper surface of the rigid member 32B is joined to the flexible antenna 11, and the lower surface of the rigid member 32B is in contact with the motherboard 35.

Similarly to the mobile device 23 (see FIG. 3), the mobile device 33 significantly reduces or prevents variations in the relative positional relationship between the flexible antenna 11 and the conductor pattern of the inductor bridge 36. Accordingly, variations in the characteristic of the flexible antenna 11 are significantly reduced or prevented despite the inductor bridge 36 being positioned near the flexible antenna 11.

Figure 5:
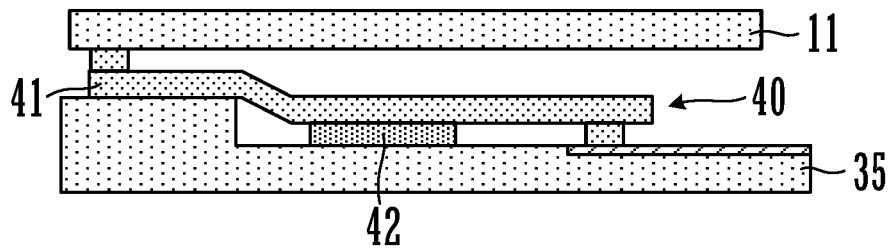
FIG. 5 is a cross-sectional view partially showing a mobile device according to a variation of the third preferred embodiment of the present invention.

FIG. 5 is a cross-sectional view showing a portion of a mobile device 43 according to a variation of the third preferred embodiment. The mobile device 43 includes a motherboard 35, a flexible antenna 11, and an electrical element 40. The electrical element 40 includes an inductor bridge 41 and a rigid member 42 being higher in rigidity than the inductor bridge 41. The inductor bridge 41 corresponds to the flexible substrate. At least one of the inductor bridge 41 and the rigid member 42 is made of thermoplastic resin. A conductor pattern that defines at least a portion of a section that performs the main function (the function as an inductor) of the electrical element 40 is provided at the inductor bridge 41. No conductor pattern that defines the section that performs the main function of the electrical element 40 is provided at the rigid member 42. The inductor bridge 41 and the rigid member 42 have their respective opposing surfaces directly joined to each other.

The rigid member 42 is disposed between the motherboard 35 and the inductor bridge 41. The upper surface of the rigid member 42 is joined to the inductor bridge 41, and the lower surface of the rigid member 42 is in contact with the motherboard 35. Other structures are similar to those of the mobile device 33 (see FIG. 4). Similarly to the mobile device 33, the mobile device 43 significantly reduces or prevents variations in the characteristic of the flexible antenna 11 despite the inductor bridge 41 being positioned near the flexible antenna 11.

Fourth Preferred Embodiment

Figure 6A:
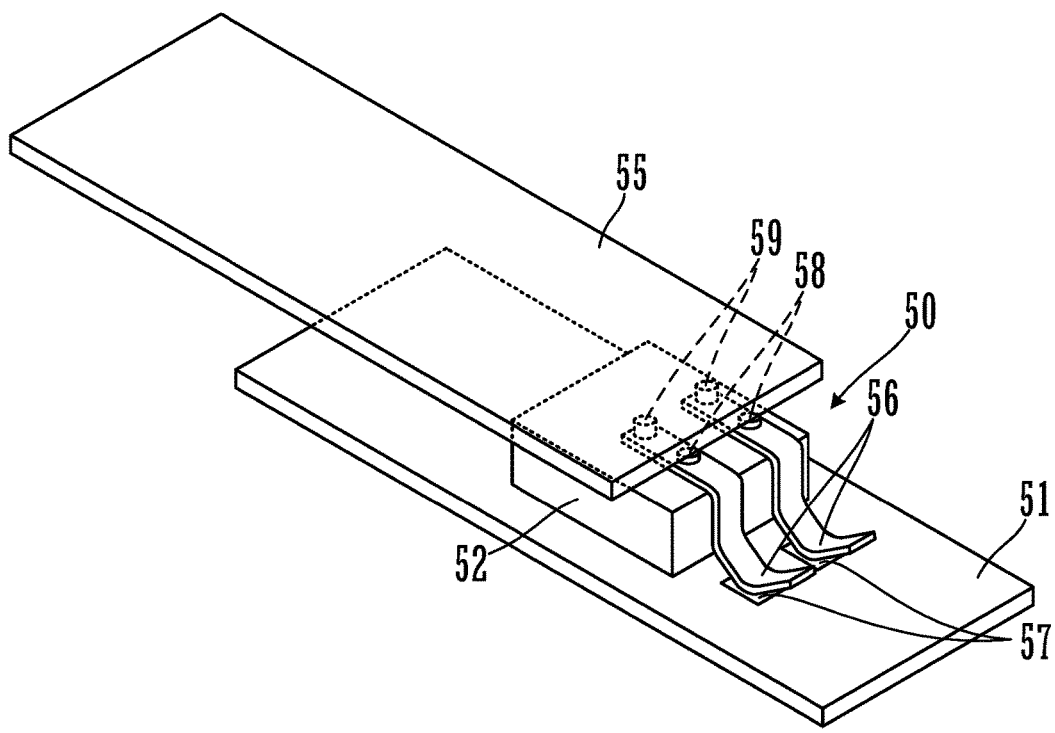
FIG. 6A is an external perspective view showing the connection structure between an electrical element and a printed circuit board according to a fourth preferred embodiment of the present invention.
Figure 6B:
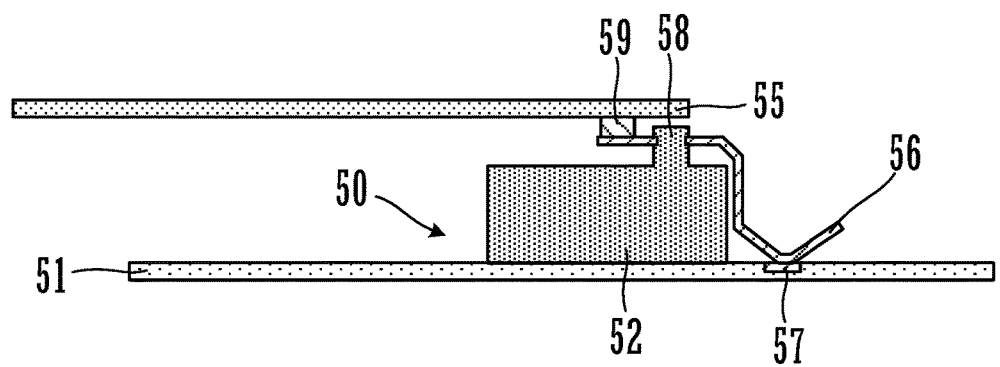
FIG. 6B is a cross-sectional view showing the connection structure between the electrical element and the printed circuit board according to the fourth preferred embodiment of the present invention.

A description will be given of an electrical element according to a fourth preferred embodiment of the present invention. FIG. 6A is an external perspective view showing the connection structure between the electrical element 50 and a printed circuit board 55. FIG. 6B is a cross-sectional view showing the connection structure between the electrical element 50 and the printed circuit board 55.

The printed circuit board 55 and lands 57 of a flexible substrate 51 are connected to each other via spring terminals 56. By projections 58 of a rigid member 52 being inserted into through holes of the spring terminals 56, the spring terminals 56 are disposed at predetermined positions and supported by the rigid member 52.

The electrical element 50 includes the flexible substrate 51 and the rigid member 52 being higher in rigidity than the flexible substrate 51. At least one of the flexible substrate 51 and the rigid member 52 is made of thermoplastic resin. A conductor pattern that defines at least a portion of a section that performs the main function of the electrical element 50 is provided at the flexible substrate 51. No conductor pattern that defines the section that performs the main function of the electrical element 50 is provided at the rigid member 52. The flexible substrate 51 and the rigid member have their respective opposing surfaces directly joined to each other.

The rigid member 52 is joined to the upper surface of the flexible substrate 51. Two projections 58 are provided at the upper surface of the rigid member 52. The two projections 58 are aligned along the short-side direction of the flexible substrate 51. A groove runs around the side surface of each of the projections 58 of the rigid member 52 at a position distanced by a predetermined height from the upper surface of the flexible substrate 51. Two lands 57 are provided along the edge of the rigid member 52 in a plan view at the upper surface of the flexible substrate 51. The two lands 57 are aligned along the short-side direction of the flexible substrate 51.

The printed circuit board 55 is disposed above the flexible substrate 51 so as to oppose to the flexible substrate 51. The short-side direction of the printed circuit board 55 is oriented in the short-side direction of the flexible substrate 51. Two spring terminals 56 are provided at the end of the lower surface of the printed circuit board 55 via solder 59. The two spring terminals 56 are aligned along the short-side direction of the printed circuit board 55.

The spring terminals 56 are each an elastic metal plate. The spring terminals 56 each include a first end connected to the printed circuit board 55 via the solder 59 and a second end positioned opposite to the first end. The spring terminals 56 extend along the upper and side surfaces of the rigid member 52. Each spring terminal 56 is provided with a through hole at a portion extending along the upper surface of the rigid member 52. The projections 58 of the rigid member 52 fit into the through holes of the spring terminals 56, and the edge of the through hole of each spring terminal 56 engages with the groove of each projection 58 of the rigid member 52. Each spring terminal 56 includes a bent portion on its second end side. The bent portions of the spring terminals 56 are pressed against the lands 57 and in contact with the lands 57. Thus, the spring terminals 56 and the lands 57 are electrically connected to each other.

Similarly to the first preferred embodiment, the fourth preferred embodiment enables precise disposition of the rigid member 52. By virtue of the projections 58 of the rigid member 52 fixing the positions of the spring terminals 56, the spring terminals 56 are able to be disposed precisely and supported stably. Elastic deformation of the spring terminals 56 produce stress, which presses the bent portions of the spring terminals 56 against the lands 57. As a result, the spring terminals 56 and the lands 57 are able to be surely electrically connected to each other.

Fifth Preferred Embodiment

Figure 7A:
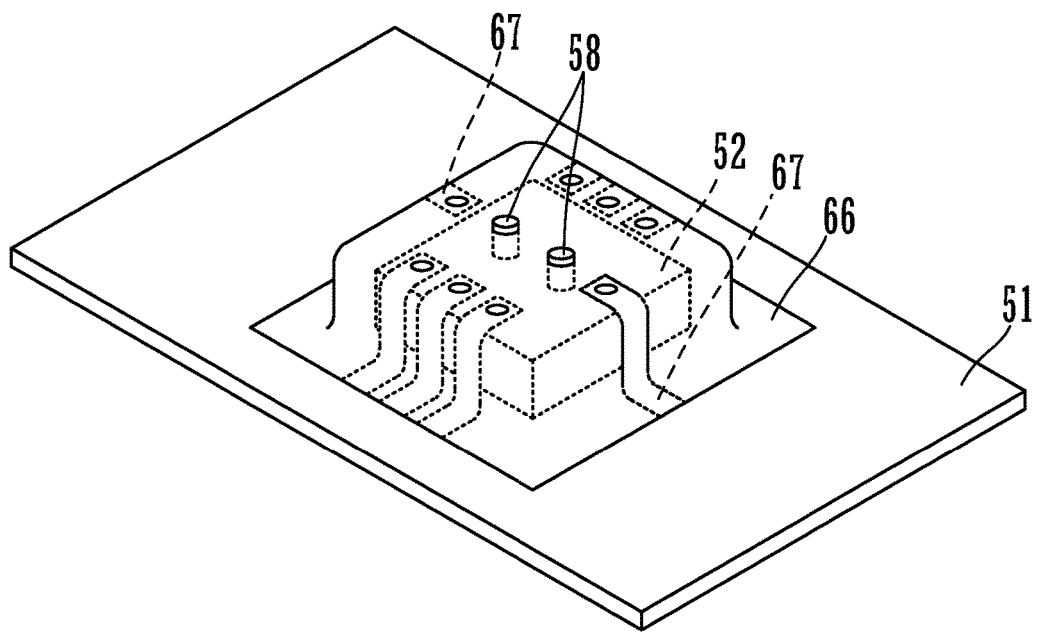
FIG. 7A is an external perspective view showing the connection structure between an electrical element and a printed circuit board according to a fifth preferred embodiment of the present invention.
Figure 7B:
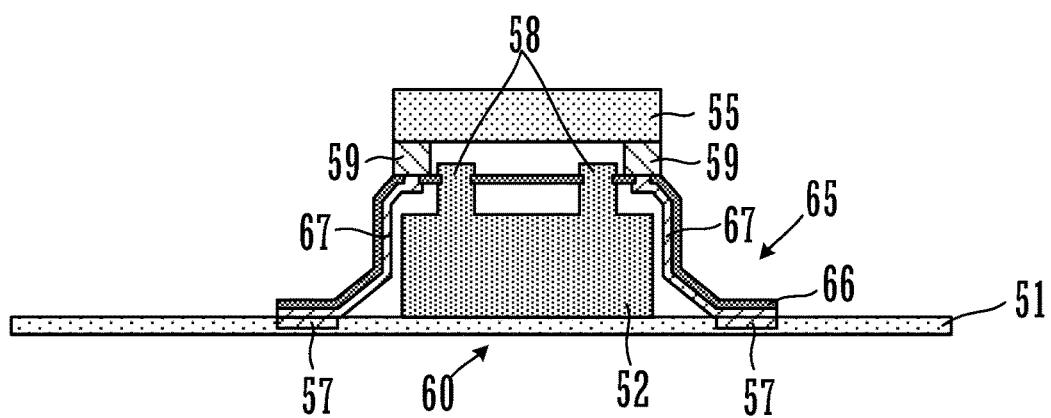
FIG. 7B is a schematic cross-sectional view showing the connection structure between the electrical element and the printed circuit board according to the fifth preferred embodiment of the present invention.

A description will be given of an electrical element according to a fifth preferred embodiment of the present invention. FIG. 7A is an external perspective view showing the connection structure between the electrical element 60 and a printed circuit board 55. FIG. 7B is a schematic cross-sectional view showing the connection structure between the electrical element 60 and the printed circuit board 55. Note that, FIG. 7A does not show the printed circuit board 55.

The printed circuit board 55 and lands 57 of a flexible substrate 51 are connected to each other via conductor patterns 67 of a joining terminal 65. The joining terminal 65 is provided to cover a rigid member 52. By projections 58 of the rigid member 52 being fitted into through holes of a resin cap of the joining terminal 65, the joining terminal 65 is disposed at a predetermined position and supported by the rigid member 52.

The electrical element 60 includes the flexible substrate 51 and the rigid member 52 being higher in rigidity than the flexible substrate 51. At least one of the flexible substrate 51 and the rigid member 52 is made of thermoplastic resin. A conductor pattern that defines at least a portion of a section that performs the main function of the electrical element 60 is provided at the flexible substrate 51. No conductor pattern that defines the section that performs the main function of the electrical element 60 is provided at the rigid member 52. The flexible substrate 51 and the rigid member have their respective opposing surfaces directly joined to each other.

The rigid member 52 is joined to the upper surface of the flexible substrate 51. Two projections 58 provided at the upper surface of the rigid member 52 are aligned along the short-side direction of the flexible substrate 51. Eight lands surround the rigid member 52 in a plan view at the upper surface of the flexible substrate 51. In a plan view, three lands 57 are located along each of edges of the rigid member 52, which is in parallel or substantially in parallel to the long-side direction of the flexible substrate 51. In a plan view, one land 57 is located along each of edges of the rigid member 52, which is in parallel or substantially in parallel to the short-side direction of the flexible substrate 51.

The short-side direction of the printed circuit board 55 is oriented in the long-side direction of the flexible substrate 51. The joining terminal 65 is provided at the lower surface of the printed circuit board 55 via solder 59. The joining terminal 65 includes the resin cap 66 made of resin, and the conductor patterns 67 provided at the resin cap 66. The resin cap 66 is box-shaped, and has a quadrangular opening. On the opening side at the side surface of the resin cap 66, a peripheral portion extends in the direction perpendicular or substantially perpendicular to the side surface of the resin cap and toward the outside of the resin cap 66. At the bottom surface of the resin cap 66, two through holes aligned along the long-side direction of the flexible substrate 51 are provided. The resin cap 66 is disposed such that its opening is oriented downward and its peripheral portion is in contact with the upper surface of the flexible substrate 51. The projections 58 of the rigid member 52 fit into the through holes of the resin cap 66, and the edge of each through hole of the resin cap 66 engages with a groove of each projection 58 of the rigid member 52.

Three conductor patterns 67 are provided at the inner side surface along each of the sides of the resin cap 66, which is in parallel or substantially in parallel to the long-side direction of the flexible substrate 51. One conductor pattern 67 is provided at the inner side surface along each of the sides of the resin cap 66, which is in parallel or substantially parallel to the short-side direction of the flexible substrate 51.

The conductor patterns 67 extend from the edge of the bottom surface of the resin cap 66 to the peripheral portion of the resin cap 66. Of the ends of the conductor patterns 67, first ends on the bottom surface side of the resin cap 66 penetrate the resin cap 66 from the inner surface side thereof to the outer surface side thereof, and are exposed outside the resin cap 66. The first ends of the conductor patterns 67 are connected to the printed circuit board 55 via solder 59. Of the ends of the conductor pattern 67, second ends on the peripheral portion side of the resin cap 66 are in contact with the lands 57 of the flexible substrate 51.

Similarly to the fourth preferred embodiment, the fifth preferred embodiment is able to reliably electrically connect the conductor patterns 67 of the joining terminal 65 and the lands 57 of the flexible substrate 51 to each other.

Sixth Preferred Embodiment

Figure 8:
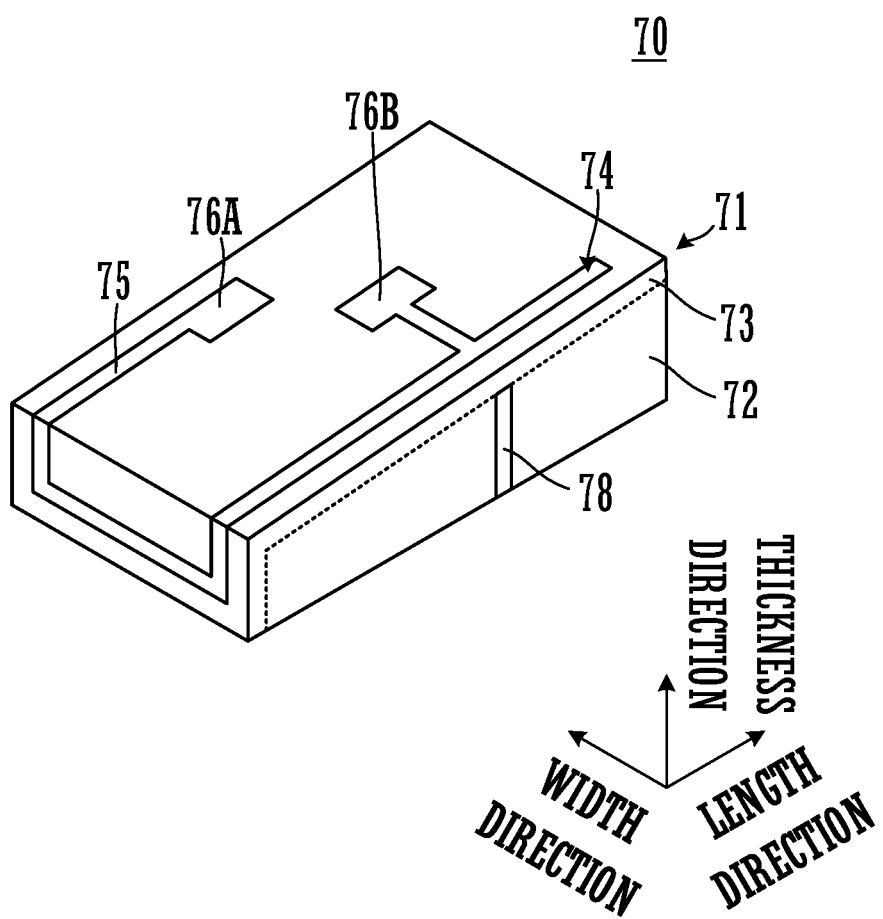
FIG. 8 is an external perspective view of an electrical element according to a sixth preferred embodiment of the present invention.
Figure 9:
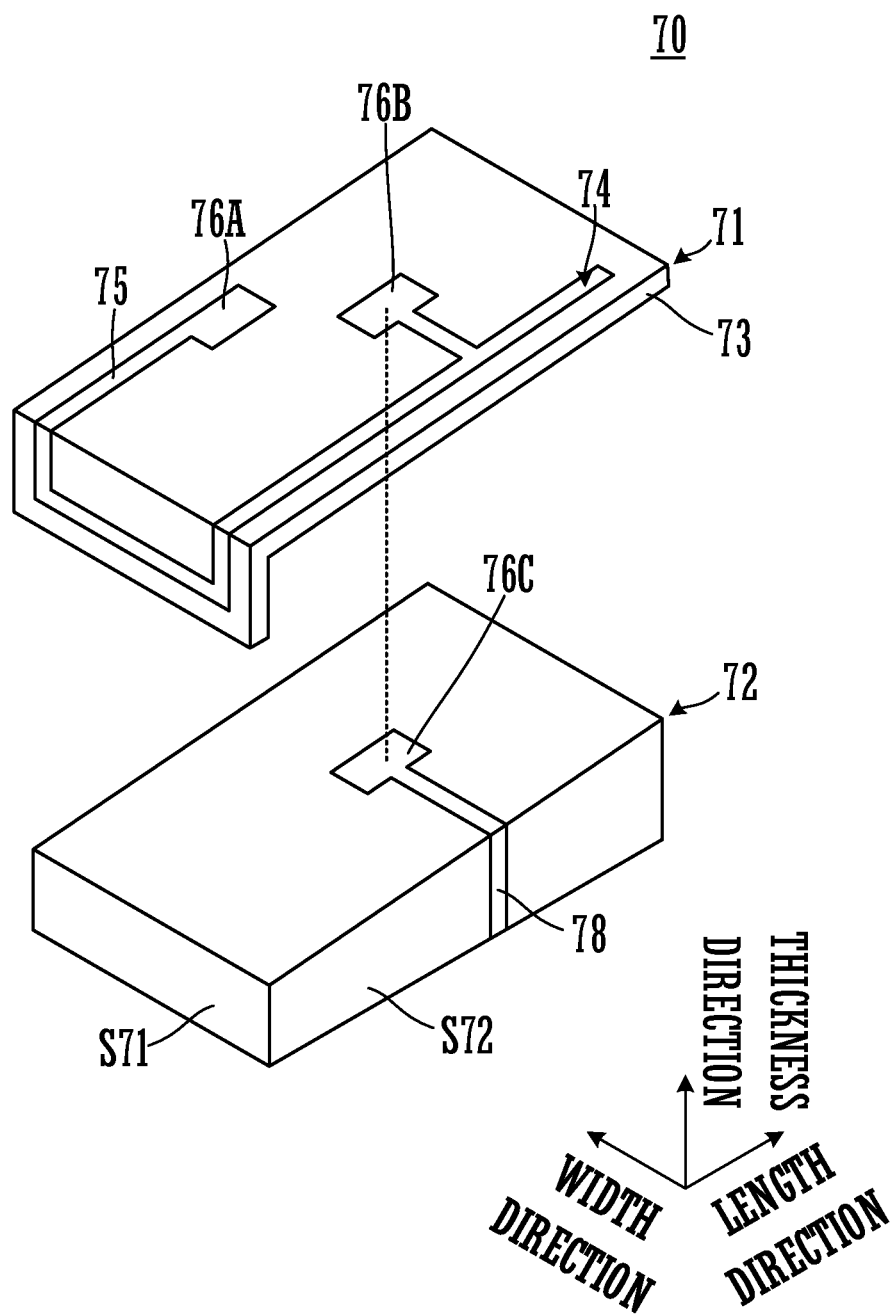
FIG. 9 is an exploded perspective view of the electrical element according to the sixth preferred embodiment of the present invention.
Figure 10A:
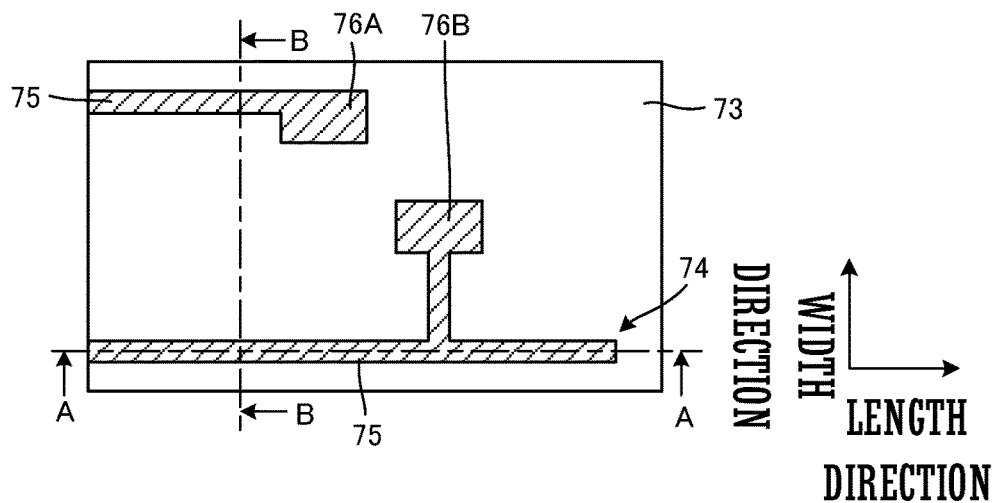
FIG. 10A is a plan view of the electrical element according to the sixth preferred embodiment of the present invention.
Figure 10B:
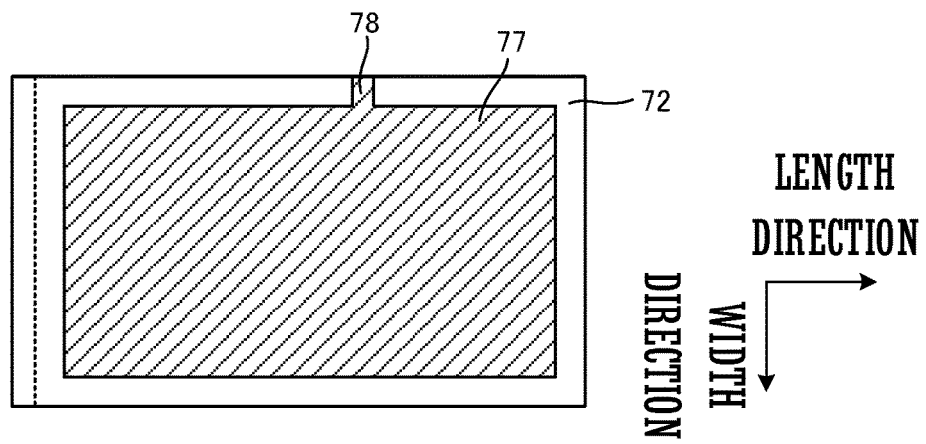
FIG. 10B is a bottom view of the electrical element according to the sixth preferred embodiment of the present invention.

A description will be given of an electrical element according to a sixth preferred embodiment of the present invention. FIG. 8 is an external perspective view of the electrical element 70. FIG. 9 is an exploded perspective view of the electrical element 70. FIG. 10A is a plan view of the electrical element 70. FIG. 10B is a bottom view of the electrical element 70.

A conductor pattern 77 and a lead-out wiring 78 are provided at a rigid member 72. The conductor pattern 77 is disposed on substantially the entire surface of the rigid member 72, which is opposite to a surface of the rigid member 72 joined to a flexible antenna 71. The lead-out wiring 78 extends from the conductor pattern 77 to the surface of the rigid member 72 joined to the flexible antenna 71, and connected to an antenna pattern 74 (part of an antenna circuit). The conductor pattern 77 is the ground conductor.

The electrical element 70 includes the flexible antenna 71 and the rigid member 72 being higher in rigidity than the flexible antenna 71. A base layer 73 and the rigid member 72 of the flexible antenna 71 are made of thermoplastic resin. A conductor pattern that defines a section that performs the main function of the electrical element 70 is provided at the flexible antenna 71. No conductor pattern that defines the section that performs the main function of the electrical element 70 is provided at the rigid member 72. The flexible antenna 71 and the rigid member 72 have their respective opposing surfaces directly joined to each other.

The electrical element 70 is rectangular or substantially rectangular parallelepiped-shaped. The side surface which is perpendicular or substantially perpendicular to the width direction of the electrical element 70 is trapezoidal. The flexible antenna 71 is defined by the quadrangular plate-shaped base layer 73 being bent. The flexible antenna 71 is disposed on the entire upper surface of the rigid member 72, and the entire side surface S71 which is perpendicular or substantially perpendicular to the length direction of the electrical element 70. The flexible antenna 71 is disposed across the upper surface and the side surface S71 of the rigid member 72. The flexible antenna 71 and the rigid member 72 are integrated. No joining member such as an adhesive agent is interposed between the flexible antenna 71 and the rigid member 72.

An antenna pattern 74 is provided at the main surface of the base layer 73, which is on the opposite side relative to the rigid member 72. The antenna pattern 74 is a conductor pattern that defines a section that performs the main function (the function as an antenna) of the electrical element 70. The antenna pattern 74 includes a radiating electrode pattern 75 and connection terminal electrodes 76A and 76B. The radiating electrode pattern 75 extends along the edge of the main surface of the base layer 73. The connection terminal electrode 76A is provided at one end of the radiating electrode pattern 75. An extending portion that extends in the width direction of the electrical element 70 is provided near other end of the radiating electrode pattern 75. The connection terminal electrode 76B is provided at an end of the extending portion. The connection terminal electrode 76A is connected to a power supply circuit (not shown). The connection terminal electrode 76B is connected to ground.

The rigid member 72 is rectangular or substantially rectangular parallelepiped-shaped. A side surface S72 is perpendicular or substantially perpendicular to the width direction of the rigid member 72 and is trapezoidal. Note that, the rigid member according to the sixth preferred embodiment may be rectangular or substantially rectangular parallelepiped-shaped. At the rigid member 72, the quadrangular plate-shaped conductor pattern 77, the lead-out wiring 78, and a connection terminal electrode 76C are provided. The conductor pattern 77 defines and functions as a ground. The conductor pattern 77, the lead-out wiring 78, and the connection terminal electrode 76C are not patterned taking into consideration the characteristic of the main function of the electrical element 70, and therefore are not conductor patterns that define a section that performs the main function of the electrical element 70.

The conductor pattern 77 is disposed substantially on the entire lower surface of the rigid member 72. The lead-out wiring 78 extends from the conductor pattern 77 to the upper surface of the rigid member 72. The lead-out wiring 78 extends from the lower surface of the rigid member 72 to the upper surface thereof via the side surface S72 of the rigid member 72. The connection terminal electrode 76C is provided at an end of the lead-out wiring 78, which is on the upper surface side of the rigid member 72. The connection terminal electrode 76C overlaps the connection terminal electrode 76B in a plan view. The connection terminal electrode 76B and the connection terminal electrode 76C are connected to each other via an interlayer connection conductor (not shown) provided at the flexible antenna 71.

Figure 11A:
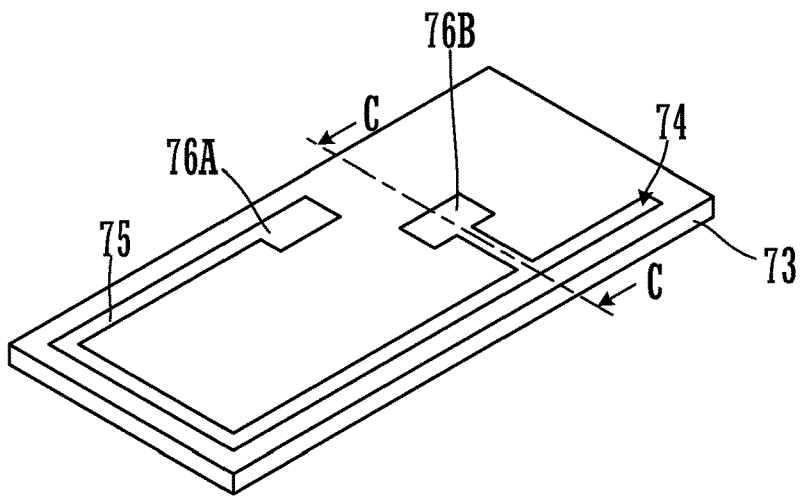
FIGS. 11A, 11B and 11C are diagrams showing a method for manufacturing the electrical element according to the sixth preferred embodiment of the present invention.
Figure 11B:
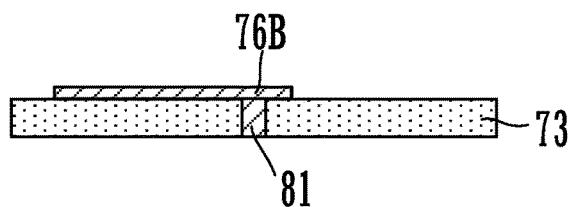
Figure 11C:
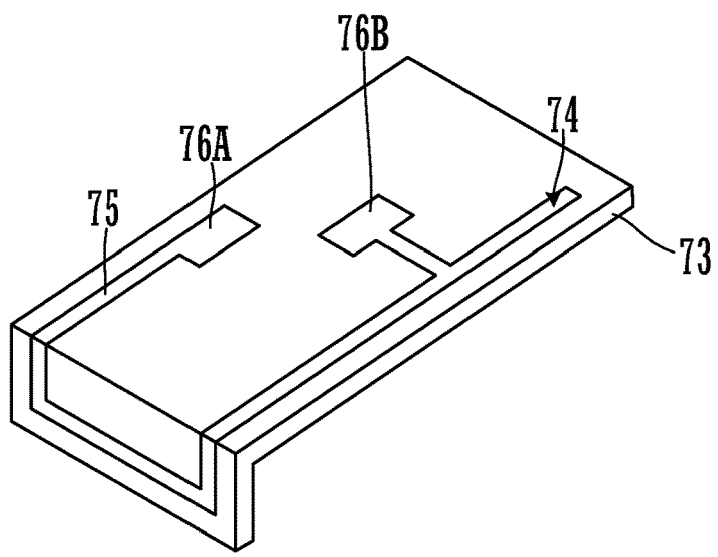

FIGS. 11A, 11B, 11C, and 12 are diagrams showing a method for manufacturing the electrical element 70. Firstly, the base layer 73 having a conductor foil bonded to the entire one surface is provided. Next, as shown in FIG. 11A, the conductor foil of the base layer 73 is patterned by etching or the like, to form the antenna pattern 74. The material of the base layer 73 is thermoplastic resin made of liquid crystal polymers or the like. The conductor foil of the base layer 73 is a copper foil or the like. Further, as shown in FIG. 11B, a through hole that penetrates through the base layer 73 is provided at a position overlapping the connection terminal electrode 76B in a plan view. Then, the through hole is filled with a conductive paste 81. The conductive paste 81 is made of a conductive material such as a Cu—Sn-based material. Next, as shown in FIG. 11C, the base layer 73 is bent along the short-side direction of the base layer 73, so that the surface of the base layer 73 on which the antenna pattern 74 is formed becomes the outer surface.

Figure 12:
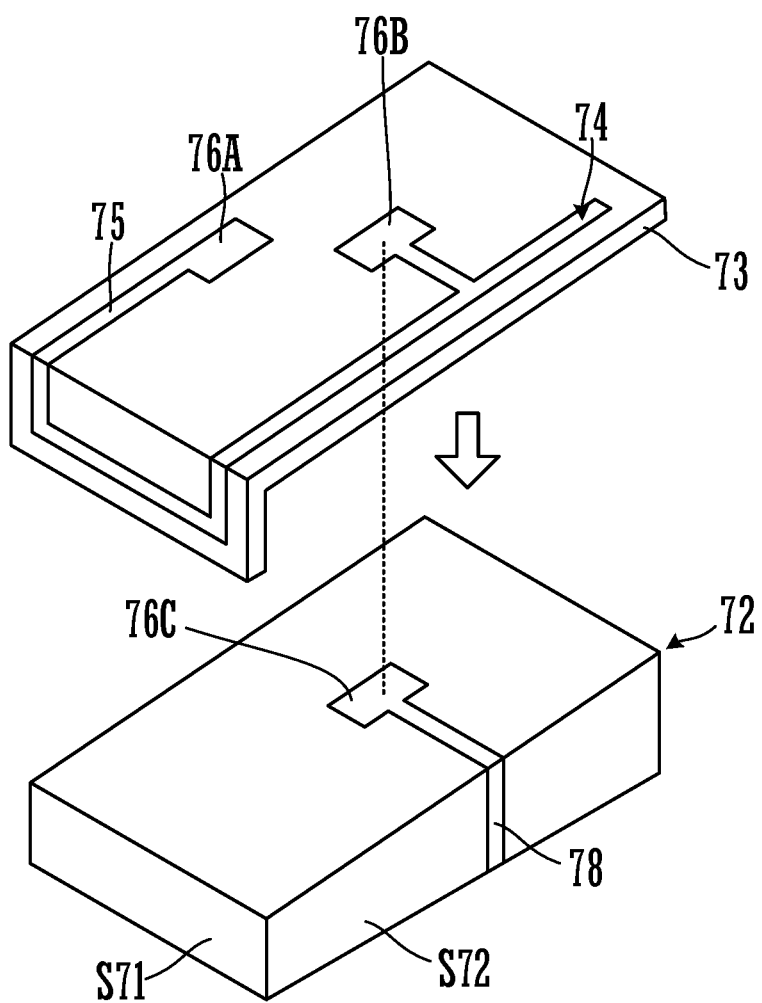
FIG. 12 is a diagram showing the method for manufacturing the electrical element according to the sixth preferred embodiment of the present invention.

Next, as shown in FIG. 12, the base layer 73 is disposed so as to conform to the upper surface and the side surface S71 of the rigid member 72. The material of the rigid member 72 is thermoplastic resin made of liquid crystal polymers or the like. At the rigid member 72, the conductor pattern 77 (see FIG. 10B), the lead-out wiring 78, and the connection terminal electrode 76C are formed preferably by a laser or plating. The base layer 73 is heated while being pressed against the rigid member 72. Thus, the base layer 73 and the rigid member 72 are thermocompression bonded. In the thermocompression, the conductive paste 81 (see FIG. 11B) cures and forms an interlayer connection conductor joined to the connection terminal electrodes 76B and 76C. This allows the base layer 73 of the flexible antenna 71 and the rigid member 72 to be directly joined to each other with ease having no bonding member interposed between them. This also allows the conductor portion of the flexible antenna 71 and the conductor portion of the rigid member 72 to be directly joined to each other with ease having no bonding member interposed between them. The foregoing processes complete the electrical element 70.

Figure 13A:
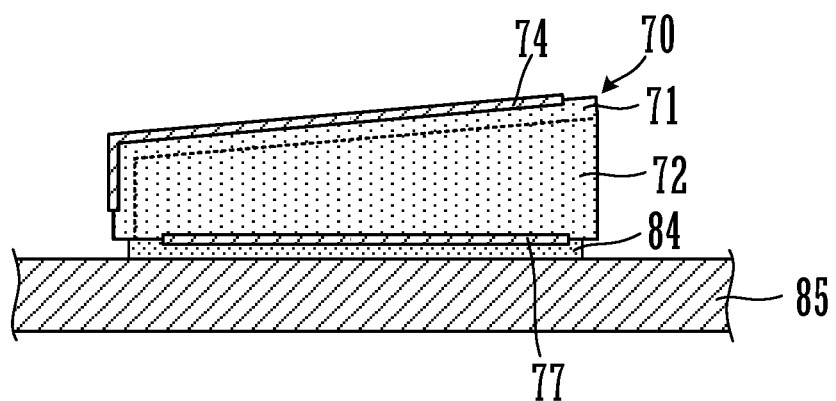
FIG. 13A is a cross-sectional view showing the disposition relationship between the electrical element and a metal housing according to the sixth preferred embodiment of the present invention.
Figure 13B:
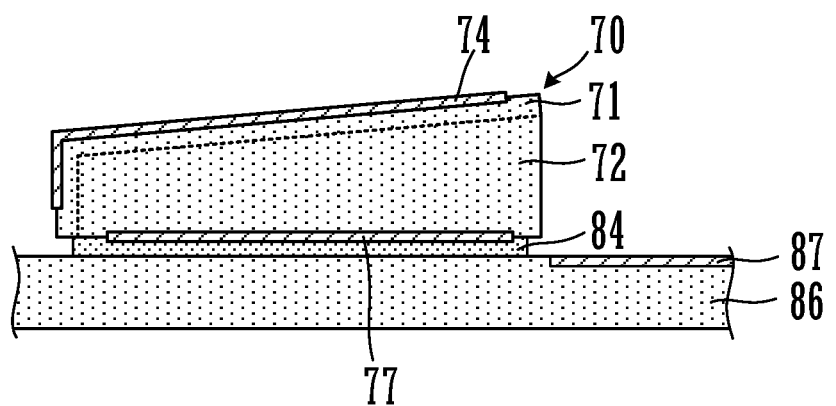
FIG. 13B is a cross-sectional view showing the disposition relationship between the electrical element and an insulating substrate according to the sixth preferred embodiment of the present invention.

FIG. 13A is a cross-sectional view showing the disposition relationship between the electrical element 70 and a metal housing 85. The cross section of the electrical element 70 shown in FIG. 13A corresponds to the cross section taken along line A-A in FIG. 10A. The electrical element 70 and the metal housing 85 are in close proximity to each other. The electrical element 70 is disposed such that the main surface of the conductor pattern 77 and the main surface of the metal housing 85 oppose each other. The electrical element 70 is fixed to the metal housing 85 with an adhesive sheet 84 such as a double-sided tape. Note that, the electrical element 70 may be fixed to the metal housing 85 with screws. Further, as shown in FIG. 13B, the electrical element 70 may be disposed in close proximity to an insulating substrate 86 where a conductor pattern 87 is formed. The electrical element 70 is disposed such that the main surface of the conductor pattern 77 and the main surface of the insulating substrate 86 oppose each other.

When an electrical element having an antenna pattern is fixed to a metal housing, the distance between the antenna pattern and the metal housing influences the characteristic of the electrical element. On the other hand, fixing the electrical element to the metal housing with an adhesive sheet or screws increases variations in the distance between the antenna pattern and the metal housing. This may result in an increase in variations in the characteristic of the electrical element.

In the sixth preferred embodiment, the conductor pattern 77 that defines and functions as a ground is disposed on the entire lower surface of the rigid member 72. As shown in FIG. 13A, when the electrical element 70 is disposed such that the main surface of the conductor pattern 77 and the main surface of the metal housing 85 oppose each other, the distance between the antenna pattern 74 and the metal housing 85 has little or no influence on the characteristic of the electrical element 70, and the distance between the antenna pattern 74 and the conductor pattern 77 mainly influences the characteristic of the electrical element 70. On the other hand, as described above, the reduced variations in the dimensional precision of the flexible antenna 71 and the rigid member 72 being joined to each other and the reduced variations in the positional precision of the rigid member 72 relative to the flexible antenna 71 suppress variations in the distance between the antenna pattern 74 and the conductor pattern 77. Accordingly, even if the electrical element 70 is fixed to the metal housing with an adhesive sheet or screws, variations in the characteristic of the electrical element 70 are significantly reduced or prevented.

Further, when an electrical element is disposed on an insulating substrate where a conductor pattern is provided, the positional relationship between the electrical element and the conductor pattern on the insulating substrate, that is, the position of the electrical element on the main surface of the insulating substrate also influences the characteristic of the electrical element. In the sixth preferred embodiment, as shown in FIG. 13B, when the electrical element 70 is disposed such that the main surface of the conductor pattern 77 provided on substantially the entire lower surface of the rigid member 72 and the main surface of the insulating substrate 86 oppose each other, the positional relationship between the antenna pattern 74 and the conductor pattern 87 of the insulating substrate 86 has little or no influence on the characteristic of the electrical element 70. Accordingly, irrespective of the position of the electrical element 70 on the main surface of the insulating substrate 86, the characteristic of the electrical element 70 is stabilized. Note that, the similar effect can be exhibited also in the case where the electrical element 70 is disposed near a resin housing which partially includes a conductor portion.

Further, since the distance between the antenna pattern 74 and the metal housing 85 has little or no influence on the characteristic of the electrical element 70, high precision is not required of the distance between the antenna pattern 74 and the metal housing 85. Still further, since the housing has little or no influence on the characteristic of the electrical element 70, the housing can be more freely designed.

Figure 14:
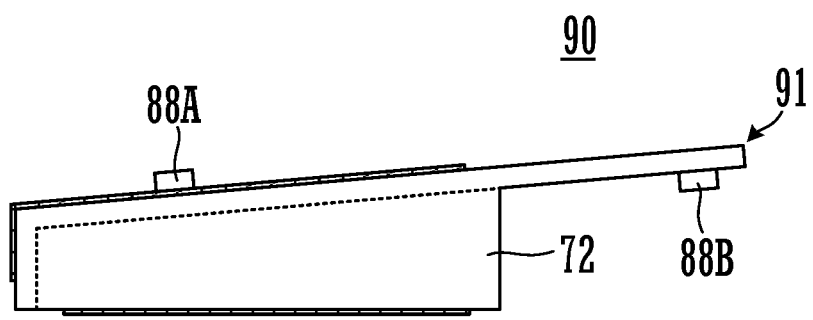
FIG. 14 is a side view of an electrical element according to a variation of the sixth preferred embodiment of the present invention.

Next, a description will be given of an electrical element 90 according to a variation of the sixth preferred embodiment. FIG. 14 is a side view of the electrical element 90. A flexible antenna 91 is disposed at the upper surface of a rigid member 72. One end of the flexible antenna 91 extends while bending, so as to conform to the side surface of the rigid member 72. Other end of the flexible antenna 91 extends so as to project from the rigid member 72. A mounting component 88A is provided at the main surface of the flexible antenna 91, which is on the opposite side relative to the rigid member 72. A mounting component 88B is provided at the main surface of the flexible antenna 91 which is on the rigid member 72 side and at the other end of flexible antenna 91. The mounting components 88A and 88B may be, for example, a chip component including a matching circuit, a connector and the like. In this manner, mounting components may be mounted on portions other than the joining portion of the flexible antenna.

Seventh Preferred Embodiment

Figure 15A:
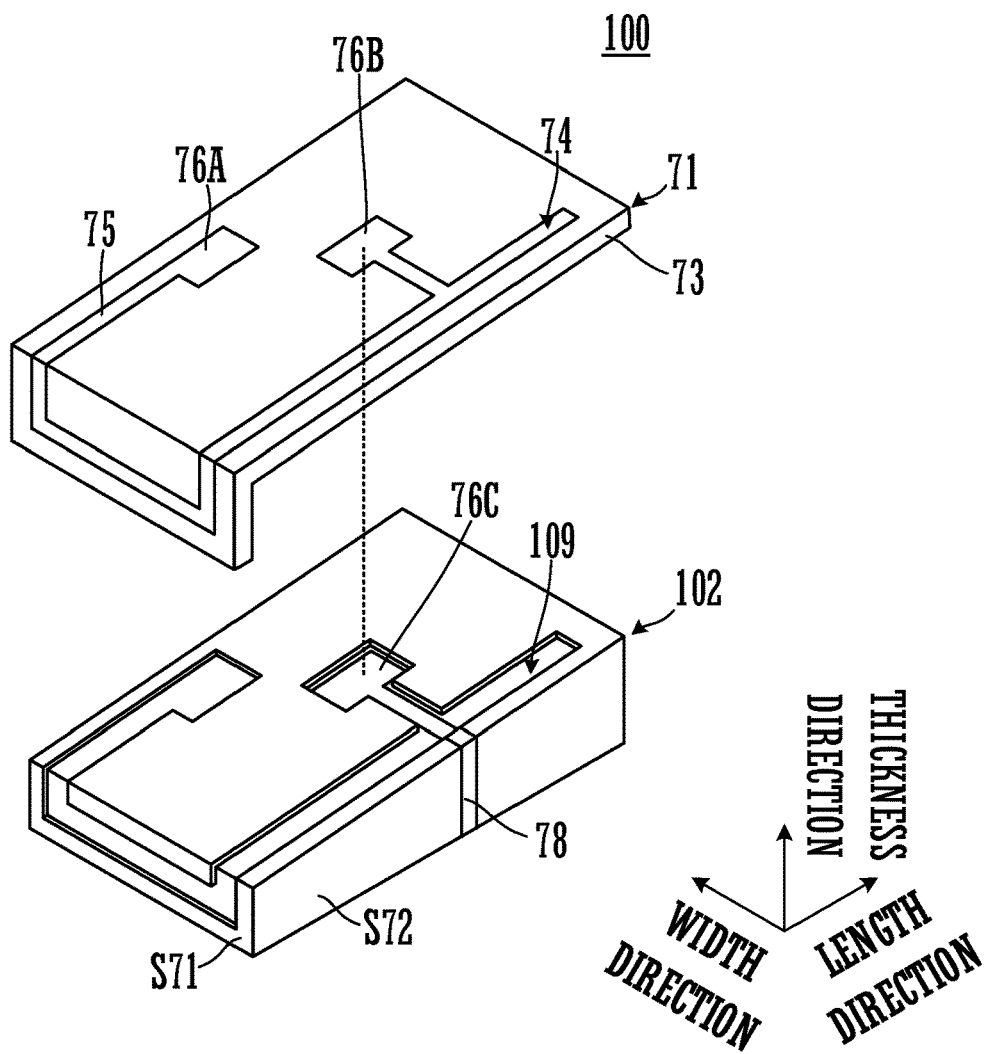
FIG. 15A is an exploded perspective view of an electrical element according to a seventh preferred embodiment of the present invention.

A description will be given of an electrical element 100 according to a seventh preferred embodiment of the present invention. The exterior of the electrical element 100 is similar to that shown in FIGS. 8, 10A and 10B. FIG. 15A is an exploded perspective view of the electrical element 100.

Figure 15B:
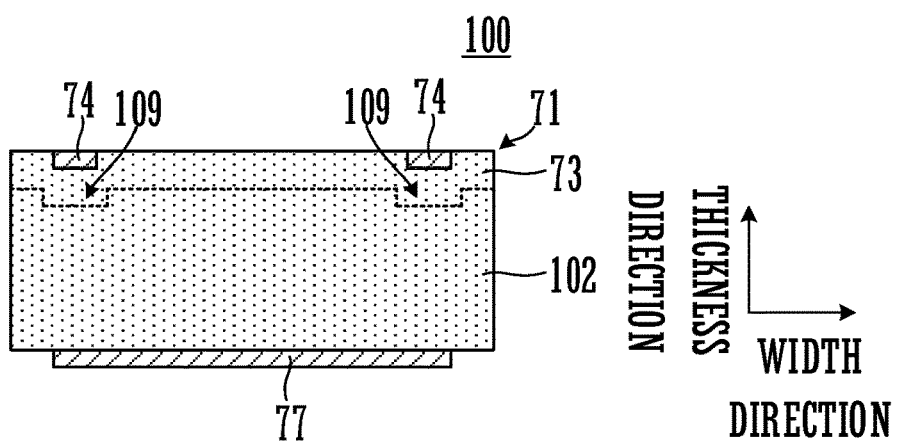
FIG. 15B is a cross-sectional view of the electrical element according to the seventh preferred embodiment of the present invention taken along line B-B.

FIG. 15B is a cross-sectional view of the electrical element 100 taken along line B-B. The description will be given of the seventh preferred embodiment focusing on the difference from the sixth preferred embodiment.

A recess 109 is provided at the upper surface and side surface S71 of a rigid member 102. The recess 109 is disposed at the position identical to that of an antenna pattern 74 as seen from the direction perpendicular to the main surface of a flexible antenna 71. Note that, while a connection terminal electrode 76C is provided at the recess 109, the portion where the connection terminal electrode 76C is provided may not be recessed. This surely connects an interlayer connection conductor of the flexible antenna 71 and the connection terminal electrode 76C to each other in ultrasonic welding, which will be described later. The exposed surface of the flexible antenna 71 is made flat by the antenna pattern 74 being buried in a base layer 73. At the main surface of the base layer 73 on the rigid member 102 side, a portion that fits into the recess 109 of the rigid member 102 is provided.

Figure 16A:
FIGS. 16A, 16B and 16C are cross-sectional views showing a method for manufacturing the electrical element according to the seventh preferred embodiment of the present invention.
Figure 16B:
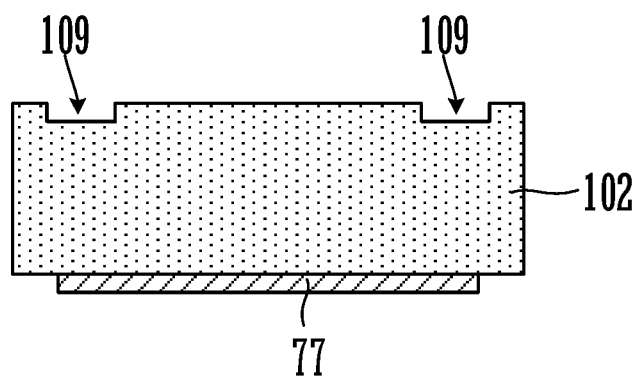
Figure 16C:
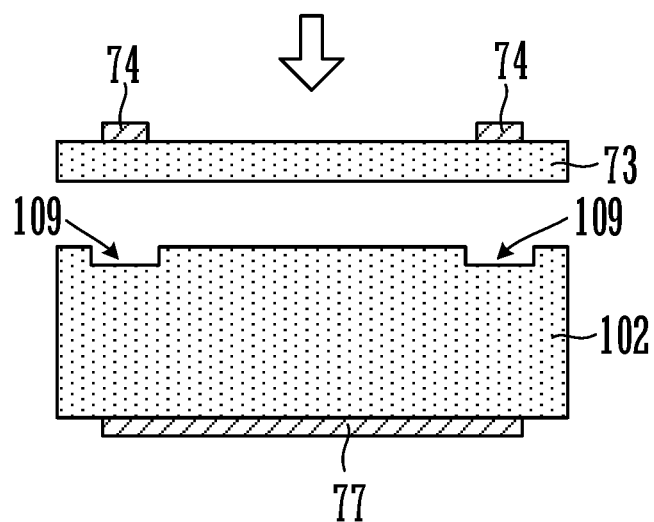

FIGS. 16A, 16B, and 16C are cross-sectional views showing a non-limiting example of a method for manufacturing the electrical element 100. Firstly, as shown in FIG. 16A, the base layer 73 provided with the antenna pattern 74 and the like is provided. Next, as shown in FIG. 16B, the rigid member 102 provided with a conductor pattern 77, the recess 109 and the like are provided. The recess 109 is formed by pressing a resin member using a mold assembly having a projection. Next, as shown in FIG. 16C, the base layer 73 and the rigid member 102 are disposed such that the antenna pattern 74 and the recess 109 overlap each other in a plan view. Then, the base layer 73 and the rigid member 102 are joined to each other by ultrasonic welding. At this time, the antenna pattern 74 fits into the recess 109 via thermoplastic resin.

In the seventh preferred embodiment, the recess 109 is provided at the rigid member 102. Since the antenna pattern 74 fits into the recess 109 via thermoplastic resin in ultrasonic welding, misalignment of the flexible antenna 71 relative to the rigid member 102 is significantly reduced or prevented. Further, since pressure is evenly applied onto the main surface of the base layer 73 in ultrasonic welding, a load is prevented from concentrating onto the portion where the antenna pattern 74 is formed. Accordingly, the absence of the load concentration which may otherwise unintentionally deform the thermoplastic resin prevents any change in the characteristic of the electrical element 100.

Note that, in the seventh preferred embodiment, while the recess 109 is provided at the rigid member 102, the present invention is not limited thereto. In the present invention, a recess corresponding to the antenna pattern may be provided at the main surface of the flexible antenna on the rigid member side.

Further, while the conductor pattern that defines a section other than a section that performs the main function of the electrical element is provided at the rigid member according to the sixth preferred embodiment and the seventh preferred embodiment, the rigid member of the present invention is not limited thereto. A dummy pattern that is connected to no circuitry may be provided at the rigid member of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electrical element comprising:
   a flexible substrate; and
   a rigid member greater than the flexible substrate in thickness and in rigidity; wherein
   at least one of the flexible substrate and the rigid member is made of thermoplastic resin;
   a conductor pattern that defines at least a portion of a section that performs a main function of the electrical element is provided at the flexible substrate;
   no conductor pattern that defines the section that performs the main function of the electrical element is provided at the rigid member;
   opposing surfaces of the flexible substrate and the rigid member are directly joined to each other; and
   the rigid member is a spacer that maintains an interval between the flexible substrate and another member near the electrical element, and the another member includes a metal member.

2. The electrical element according to claim 1, wherein the conductor pattern provided at the flexible substrate defines at least a portion of a high-frequency circuit that performs the main function.

3. The electrical element according to claim 2, wherein the high-frequency circuit is an antenna circuit.

4. The electrical element according to claim 3, wherein
   the rigid member includes a first surface joined to the flexible substrate and a second surface opposite to the first surface;
   a ground conductor is disposed on substantially an entirety of the second surface of the rigid member; and
   a lead-out wiring extends from the ground conductor to the first surface of the rigid member and connects to the antenna circuit.

5. The electrical element according to claim 1, wherein no conductor pattern is provided at the rigid member.

6. The electrical element according to claim 1, wherein the flexible substrate and the rigid member are respectively made of thermoplastic resins that are identical or substantially identical to each other in a main component.

7. The electrical element according to claim 1, wherein the flexible substrate includes a portion to be bent, and the rigid member and the portion to be bent are joined to each other.

8. A mobile device comprising:
   an electrical element including:
      a flexible substrate; and
      a rigid member greater than the flexible substrate in thickness and in rigidity;
   wherein
      at least one of the flexible substrate and the rigid member is made of thermoplastic resin;
      a conductor pattern that defines at least a portion of a section that performs a main function of the electrical element is provided at the flexible substrate;
      no conductor pattern that defines the section that performs the main function of the electrical element is provided at the rigid member;
      opposing surfaces of the flexible substrate and the rigid member are directly joined to each other; and
   the electrical element is in contact with a member inside the mobile device via the rigid member, and the member inside the mobile device includes a metal member.

9. The mobile device according to claim 8, wherein the rigid member is a spacer that maintains an interval between the flexible substrate and another member near the electrical element, and the another member includes a metal member.

10. The mobile device according to claim 8, wherein the conductor pattern provided at the flexible substrate defines at least a portion of a high-frequency circuit that performs the main function.

11. The mobile device according to claim 10, wherein the high-frequency circuit is an antenna circuit.

12. The mobile device according to claim 11, wherein
the rigid member includes a first surface joined to the flexible substrate and a second surface opposite to the first surface;
a ground conductor is disposed on substantially an entirety of the second surface of the rigid member; and
a lead-out wiring extends from the ground conductor to the first surface of the rigid member and connects to the antenna circuit.

13. The mobile device according to claim 8, wherein no conductor pattern is provided at the rigid member.

14. The mobile device according to claim 8, wherein the flexible substrate and the rigid member are respectively made of thermoplastic resins that are identical or substantially identical to each other in a main component.

15. The mobile device according to claim 8, wherein the flexible substrate includes a portion to be bent, and the rigid member and the portion to be bent are joined to each other.

16. An electrical element comprising:
a flexible substrate; and
a rigid member greater than the flexible substrate in thickness and in rigidity; wherein
at least one of the flexible substrate and the rigid member is made of thermoplastic resin;
a conductor pattern that defines at least a portion of a section that performs a main function of the electrical element is provided at the flexible substrate;
no conductor pattern that defines the section that performs the main function of the electrical element is provided at the rigid member;
opposing surfaces of the flexible substrate and the rigid member are directly joined to each other;
the conductor pattern provided at the flexible substrate defines at least a portion of a high-frequency circuit that performs the main function;
the high-frequency circuit is an antenna circuit;
the rigid member includes a first surface joined to the flexible substrate and a second surface opposite to the first surface;
a ground conductor is disposed on substantially an entirety of the second surface of the rigid member; and
a lead-out wiring extends from the ground conductor to the first surface of the rigid member and connects to the antenna circuit.

17. An electrical element comprising:
a flexible substrate; and
a rigid member greater than the flexible substrate in thickness and in rigidity; wherein
at least one of the flexible substrate and the rigid member is made of thermoplastic resin;
a conductor pattern that defines at least a portion of a section that performs a main function of the electrical element is provided at the flexible substrate;
no conductor pattern that defines the section that performs the main function of the electrical element is provided at the rigid member;
opposing surfaces of the flexible substrate and the rigid member are directly joined to each other; and
the flexible substrate includes a portion to be bent, and the rigid member and the portion to be bent are joined to each other.

18. The electrical element according to claim 17, wherein the conductor pattern provided at the flexible substrate defines at least a portion of a high-frequency circuit that performs the main function.

19. The electrical element according to claim 18, wherein the high-frequency circuit is an antenna circuit.

20. The electrical element according to claim 17, wherein the flexible substrate and the rigid member are respectively made of thermoplastic resins that are identical or substantially identical to each other in a main component.

* * * * *